United States Patent
Annunziata

(10) Patent No.: US 8,743,596 B2
(45) Date of Patent: Jun. 3, 2014

(54) MAGNETORESISTIVE RANDOM ACCESS MEMORY

(71) Applicant: International Business Machines Corporation, Armonk, NY (US)

(72) Inventor: Anthony J. Annunziata, Stamford, CT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/689,052

(22) Filed: Nov. 29, 2012

(65) Prior Publication Data

US 2014/0127830 A1    May 8, 2014

Related U.S. Application Data

(63) Continuation of application No. 13/668,869, filed on Nov. 5, 2012.

(51) Int. Cl.
   *G11C 11/00* (2006.01)
(52) U.S. Cl.
   USPC ............ 365/158; 365/148; 365/171; 977/935
(58) Field of Classification Search
   USPC ......... 365/48, 55, 62, 66, 74, 78, 80–93, 100,
              365/130, 131, 148, 158, 171–173, 209, 213,
              365/225.5, 230.07, 232, 243.5; 257/421,
              257/E21.665; 438/3; 428/810–816,
              428/817–825.1, 826; 977/933–935
   See application file for complete search history.

(56) References Cited

U.S. PATENT DOCUMENTS

| | | |
|---|---|---|
| 5,286,976 A | 2/1994 | Cole |
| 5,933,365 A | 8/1999 | Klersy et al. |
| 6,023,091 A | 2/2000 | Koch et al. |
| 6,911,685 B2 | 6/2005 | Anthony et al. |
| 7,714,315 B2 | 5/2010 | Happ et al. |
| 7,855,435 B2 | 12/2010 | Klostermann et al. |
| 7,928,421 B2 | 4/2011 | Lung |
| 8,076,663 B2 | 12/2011 | Liu |
| 2002/0081753 A1* | 6/2002 | Gates et al. .................. 438/3 |
| 2003/0210586 A1* | 11/2003 | Nakajima et al. ............. 365/200 |
| 2004/0169214 A1* | 9/2004 | Nakajima et al. ............. 257/295 |
| 2005/0285093 A1 | 12/2005 | Yoshihara et al. |
| 2006/0163196 A1* | 7/2006 | Amano et al. ................. 216/22 |
| 2007/0052009 A1 | 3/2007 | Xie et al. |

(Continued)

OTHER PUBLICATIONS

Deak et al., • Effect of Resistance-Area-Product and Thermal Environment on Writing of Magneto-Thermal MRAM,• IEEE Transactions on Magnetics, vol. 42, Issue 10, Oct. 2006, pp. 2721 • 2723.

(Continued)

*Primary Examiner* — Harry W Byrne
(74) *Attorney, Agent, or Firm* — Cantor Colburn LLP; Vazken Alexanian

(57) ABSTRACT

A method of forming a magnetoresistive random access memory (MRAM) apparatus includes forming a first conductive line on a first insulating layer, forming a second insulating layer on the first conductive line and forming a magnetic tunnel junction through the second insulating layer to contact the first conductive line. The method also includes forming a cavity adjacent to the magnetic tunnel junction in the second insulating layer and forming a second conductive line on the second insulating layer to contact the magnetic tunnel junction.

5 Claims, 6 Drawing Sheets

(56) References Cited

U.S. PATENT DOCUMENTS

| | | |
|---|---|---|
| 2008/0209118 A1* | 8/2008 | Kajiyama ..................... 711/105 |
| 2009/0122597 A1* | 5/2009 | Sugibayashi et al. ......... 365/158 |
| 2009/0174015 A1* | 7/2009 | Gu et al. ....................... 257/421 |
| 2009/0218559 A1 | 9/2009 | Klostermann |
| 2011/0155987 A1 | 6/2011 | Mizuguchi et al. |
| 2012/0106245 A1 | 5/2012 | Mackay et al. |

OTHER PUBLICATIONS

International Search Report for corresponding PCT Application No. PCT/US13/50803, dated Jan. 10, 2014, pp. 1-10.
Written Opinion for corresponding PCT Application No. PCT/US13/50803, dated Jan. 10, 2014, pp. 1-4.

* cited by examiner

MAGNETORESISTIVE RANDOM ACCESS MEMORY

CROSS-REFERENCE TO RELATED APPLICATION

This application is a continuation of U.S. patent application Ser. No. 13/668,869, filed Nov. 5, 2012, the disclosure of which is incorporated by reference herein in its entirety.

BACKGROUND

Embodiments of the invention relate generally to magnetoresistive random access memory (MRAM) and, more specifically to thermally-assisted MRAM having cavities adjacent to tunnel junctions.

Magnetoresistive random access memory (MRAM) is a non-volatile computer memory (NVRAM) technology. Unlike conventional RAM chip technologies, MRAM data is not stored as electric charge or current flows, but by magnetic storage elements. The elements are formed from two ferromagnetic plates, each of which can hold a magnetic field, separated by a thin insulating layer. One of the two plates is a reference magnet set to a particular polarity; the other plate's field can be changed to match that of an external field to store the memory and is termed the "free magnet" or "free-layer". The free magnet may also be referred to as a bit, and it may store a "1" or a "0" value. This configuration is known as a magnetic tunnel junction and is the simplest structure for a MRAM bit. A memory device is built from a grid of such "cells."

One type of MRAM, called thermal MRAM, is configured to have heat applied to the tunnel junction when writing to a bit of the tunnel junction. In particular, the free magnet tends to be stable at a normal operating temperature, and it is more difficult to change magnetic polarity of the free magnet at a normal operating temperature. Providing heat to the free magnet may facilitate changing of a polarity of the free magnet to program a magnetic state of the free magnet. However, heat generated by the current flowing through the tunnel junction may be lost in surrounding insulating or dielectric layers, requiring an increase in current to generate a desired amount of heat in the tunnel junction.

SUMMARY

According to one embodiment, a magnetoresistive random access memory (MRAM) apparatus includes a first conductive line and a second conductive line. A magnetic tunnel junction is in electrical communication with the first conductive line and the second conductive line. The magnetic tunnel junction includes at least one programmable magnetic layer. The MRAM apparatus also includes an insulating layer radially surrounding the tunnel junction, and the insulating layer has a cavity adjacent to the magnetic tunnel junction.

According to one embodiment, a memory device includes a magnetoresistive random access memory (MRAM) array and a processing circuit. The MRAM array includes a plurality of MRAM cells. Each MRAM cell includes a first conductive line and a second conductive line. A magnetic tunnel junction is in electrical communication with the first conductive line and the second conductive line. The tunnel junction includes at least one programmable magnetic layer. The MRAM apparatus also includes an insulating layer radially surrounding the tunnel junction, and the insulating layer has a cavity adjacent to the magnetic tunnel junction. The processing circuit is configured to control a current supplied to the MRAM array to read and write data from and to the MRAM cells of the MRAM array.

According to another embodiment, a method of forming a magnetoresistive random access memory (MRAM) apparatus includes forming a first conductive line on a first insulating layer and forming a second insulating layer on the first conductive line. The method further includes forming a magnetic tunnel junction through the second insulating layer to contact the first conductive line and forming a cavity adjacent to the magnetic tunnel junction in the second insulating layer. The method further includes forming a second conductive line on the second insulating layer to contact the magnetic tunnel junction.

Additional features and advantages are realized through the techniques of the present invention. Other embodiments and aspects of the invention are described in detail. For a better understanding of embodiments of the invention, refer to the description and to the drawings.

BRIEF DESCRIPTION OF THE SEVERAL VIEWS OF THE DRAWINGS

Features characterizing embodiments of the present invention are described in the specification and claims which follow. These features, and advantages of embodiments of the invention are apparent from the following detailed description taken in conjunction with the accompanying drawings in which:

DETAILED DESCRIPTION

Conventional thermal MRAM devices lose heat from tunnel junctions to the surrounding dielectric or insulating layers, reducing a thermal efficiency of the tunnel junctions and degrading a programming efficiency of the MRAM device. Embodiments of the present invention are directed to an MRAM circuit having cavities located adjacent to the tunnel junctions.

Figure 1:
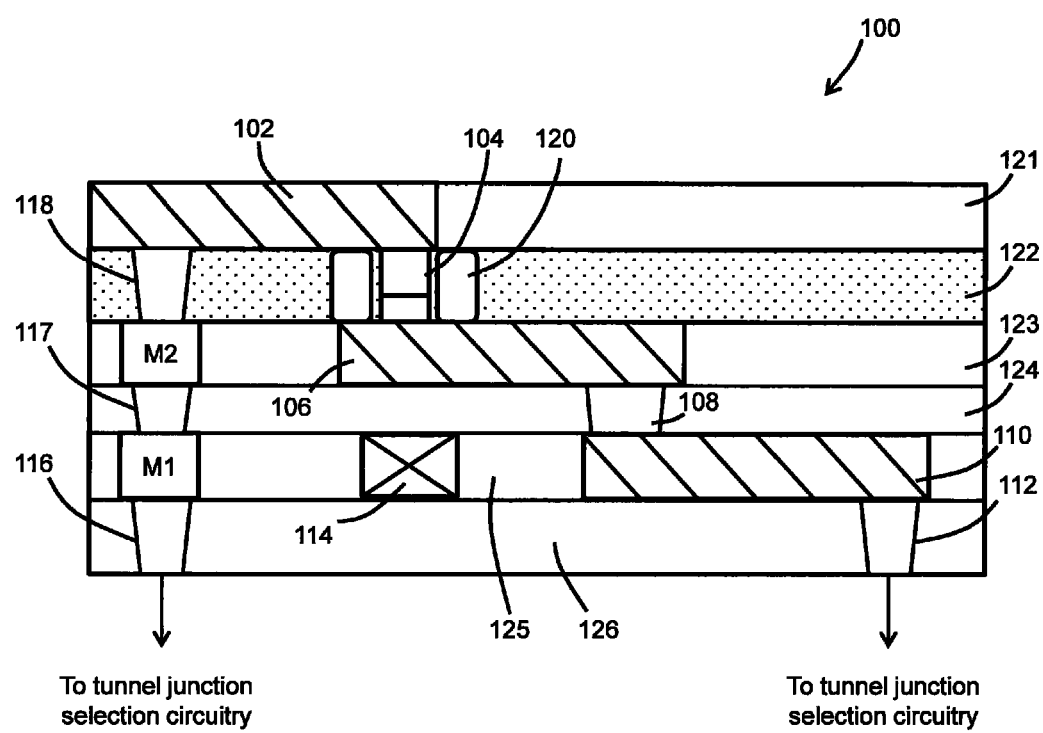
FIG. 1 illustrates a magnetoresistive random access memory (MRAM) apparatus according to one embodiment of the present invention.

FIG. 1 illustrates a magnetoresistive random access memory (MRAM) circuit 100 according to one embodiment of the present invention. In particular, FIG. 1 illustrates a side view of a cross-section of a portion of an MRAM apparatus 100. In embodiments of the present invention, the MRAM apparatus 100 may correspond to one MRAM cell from among a series of MRAM cells arranged in series and/or in parallel to form memory arrays or other memory structures for storing data. The MRAM apparatus 100 may include multiple insulating layers 121, 122, 123, 124, 125 and 126. One or more of the insulating layers 121-126 may include metal layers formed therein, such as wiring layers (e.g., M1 and M2) and vias that connect wiring layers.

The MRAM apparatus 100 includes an upper contact line 102, a magnetic tunnel junction 104 (referred to hereinafter as "tunnel junction"), and an intermediate line 106. The tunnel junction 104 is connected to both the upper contact line 102 and the intermediate line 106. The MRAM apparatus 100 further includes a lower contact line 110 and a via 108 connecting the intermediate line 106 with the lower contact line 110. The lower contact line 110 may be directly connected to tunnel junction selection circuitry, or the lower contact line 110 may be connected to the tunnel junction selection circuitry by way of one or more vias 112 extending through one or more insulating layers 126. The upper contact line 102, intermediate line 106 and lower contact line 110 may all be conductive lines or wires, such as metal wiring forming in wiring layers of a semiconductor device.

The upper contact line 102 may also be connected directly to tunnel junction selection circuitry, or the upper contact line 102 may be connected to the tunnel junction selection circuitry by way of vias 116, 117 and 118 and metal layer contacts M1 and M2. The tunnel junction selection circuitry may include any type of selection circuitry including one or more transistors that may be switched on and off to supply current through the tunnel junction 104 by way of the upper and lower contact lines 102 and 110 and the intermediate line 106.

The MRAM apparatus 100 also includes a write line 114. In FIG. 1, the "X" of the write line 114 represents a side cross-section, or in other words, the write line 114 extends towards and away from the viewpoint of the figure. However, embodiments of the invention are not limited to this particular cross-sectional configuration of the upper and lower contact lines 102 and 110, the intermediate line 106, the tunnel junction 104 and the write line 114. Instead, the configuration of FIG. 1 is provided for purposes of description, and embodiments of the invention encompass upper and lower contact lines 102 and 110, the intermediate line 106, the tunnel junction 104 and the write line 114 having varying horizontal and vertical arrangements.

In embodiments of the present invention, a cavity 120 is formed in an insulation layer 122 around the tunnel junction 104. The cavity 120 may be formed by any process, such as by chemical or laser etching, by masking during formation of the insulation layer 122, or by any other process. In one embodiment, cavity is formed by forming a self-assembling polymer on the insulating layer 122, where the self-assembling polymer arranges itself into a lattice including holes of predetermined sizes located predetermined distances from each other, according to the chemical composition of the polymer. An acid may be provided to the polymer at a location corresponding to the cavity 120, and the acid may pass through the holes to form the cavity 120. The self-assembling polymer may be removed, and the upper contact line 102 may be formed.

While FIG. 1 shows a cavity 120 adjacent to the tunnel junction 104, embodiments of the present invention encompass MRAM apparatuses 100 having cavities also adjacent to one or more of the upper contact line 102, the via 118 and the intermediate line 106. In one embodiment, the cavity 120 may have characteristics of a vacuum or near-vacuum. A near-vacuum may be defined as an environment having a small percentage of air or other gas molecules relative to normal air. For example, if a concentration of gas in normal air is defined as 100% normal air or gas concentration, then a near-vacuum may be defined as 50% or less concentration of air or gas. In another embodiment, the cavities may be filled with normal air or any other gas. For example, if the cavity is formed in an environment rich in one type of gas, such as oxygen, the cavity may have a higher percentage of oxygen than normal air. The cavity 120 may be a sealed cavity 120 to prevent gas from entering or exiting the cavity 120 after formation of the cavity 120.

In embodiments of the invention, the cavity 120 provides thermal insulation to the tunnel junction 104, thereby increasing the thermal efficiency of the tunnel junction 104. During a read or write operation, in which current is directed through the tunnel junction 104 between the upper contact line 102 and the intermediate line 106, more heat per unit of current (such as amperes, milli-amperes, etc.) is retained within the tunnel junction 104 compared to a configuration in which no cavity 120 is provided.

In embodiments of the present invention, the cavity 120 is located adjacent to the tunnel junction 104, which may mean directly or immediately adjacent to the tunnel junction 104, or having no insulating material 122 between the tunnel junction 104 and the cavity 120. Alternatively, as illustrated in FIG. 1, a sliver of insulating material 122 may be located between the tunnel junction 104 and the cavity 120. In other words, the cavity 120 being "adjacent" to the tunnel junction 104 may allow for small amounts of insulating material 122 between the tunnel junction 104 and the cavity 120, as long as the cavity 120 continues to provide thermal insulation to the tunnel junction 104. In one embodiment, the width of the insulating material 122 between the tunnel junction 104 and the cavity 120 is less than a width of the tunnel junction 104. For example, the width of the insulating material 122 between the tunnel junction 104 and the cavity 120 may be less than 10% of a width of the tunnel junction 104.

FIG. 1 illustrates two portions of a cavity 120 that surrounds the tunnel junction 104. For example, the tunnel junction 104 may have a cylindrical shape, and the cavity 120 may have an annular shape. Embodiments of the invention encompass one cavity 120 surrounding the tunnel junction 104 or any number of multiple cavities that together surround the tunnel junction 104, having small portions of insulating material 122 between the multiple cavities. The multiple cavities may be, for example, adjacent to each other in a circumferential direction around the tunnel junction 104. In other embodiments, the multiple cavity 120 may be provided in a radial direction, such that one cavity surrounds another cavity, which in turn surrounds the tunnel junction 104.

Figure 2:
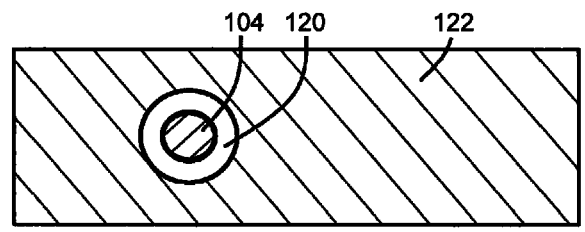
FIG. 2 illustrates a top cross-sectional view of the tunnel junction of an MRAM apparatus according to one embodiment of the invention.
Figure 3:
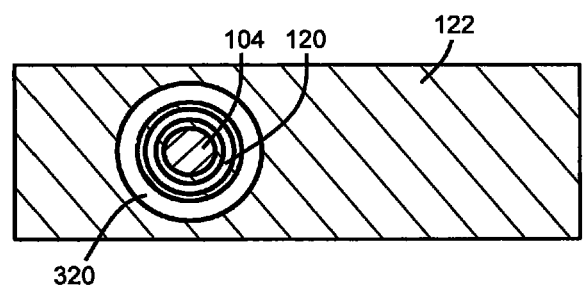
FIG. 3 illustrates a top cross-sectional view of the tunnel junction of an MRAM apparatus according to another embodiment.
Figure 4:
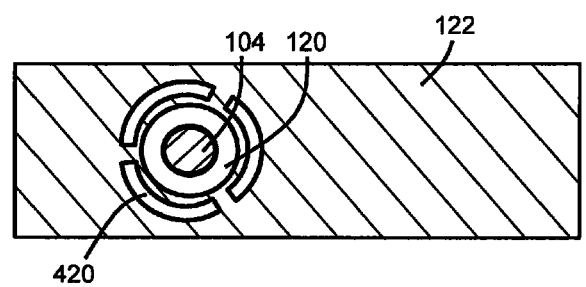
FIG. 4 illustrates a top cross-sectional view of the tunnel junction of an MRAM apparatus according to yet another embodiment.

FIGS. 2-4 illustrate example configurations of cavities according to some embodiments. In FIG. 2, the cavity 120 formed in the insulating layer 122 is a continuous annular shape that entirely surrounds the tunnel junction 104. In FIG. 3, multiple cavities 120 and 320 are formed, each radially surrounding the tunnel junction 104. The outer cavity 320 also radially surrounds the inner cavity 120. In FIG. 4, multiple circumferential cavities 420 are formed, and small portions of the insulating layer 122 separate the cavities 420 from each other.

Other configurations and shapes of tunnel junctions, cavities, upper contact lines and intermediate lines are encompassed by embodiments of the present invention, in which one or more cavities are formed adjacent to a tunnel junction within insulating material. While a cylindrical tunnel junction 104 and annular cavities 120, 320 and 420 have been illustrated by way of describing embodiments, it is understood that embodiments of the invention encompass any shape of tunnel junction and cavities, including regular polygonal shapes, such as squares, hexagons, octagons, etc., as well as oval, ovoid elliptical or other shapes.

Referring again to FIG. 1, in embodiments of the invention, the insulation layers 121-126 may be formed of any insulating material, such as semiconductor materials. Some examples include silicon nitride and silicon oxide. The upper and lower contact lines 102 and 110 and the write line 114 may be formed of low-resistivity metals, such as aluminum and copper. The intermediate line 106 may be formed of a high-resistivity metal or conductor, such as tantalum, tantalum nitride or cobalt silicon nitride. The vias 112, 116 and 118 may also be formed of low-resistivity metals or fillers. Although some examples of insulating materials, low-resistivity metals and high-resistivity metals have been provided, embodiments of the invention are not limited to these examples, and any type of insulating materials and metals may be used in association with embodiments of the invention.

Figure 5:
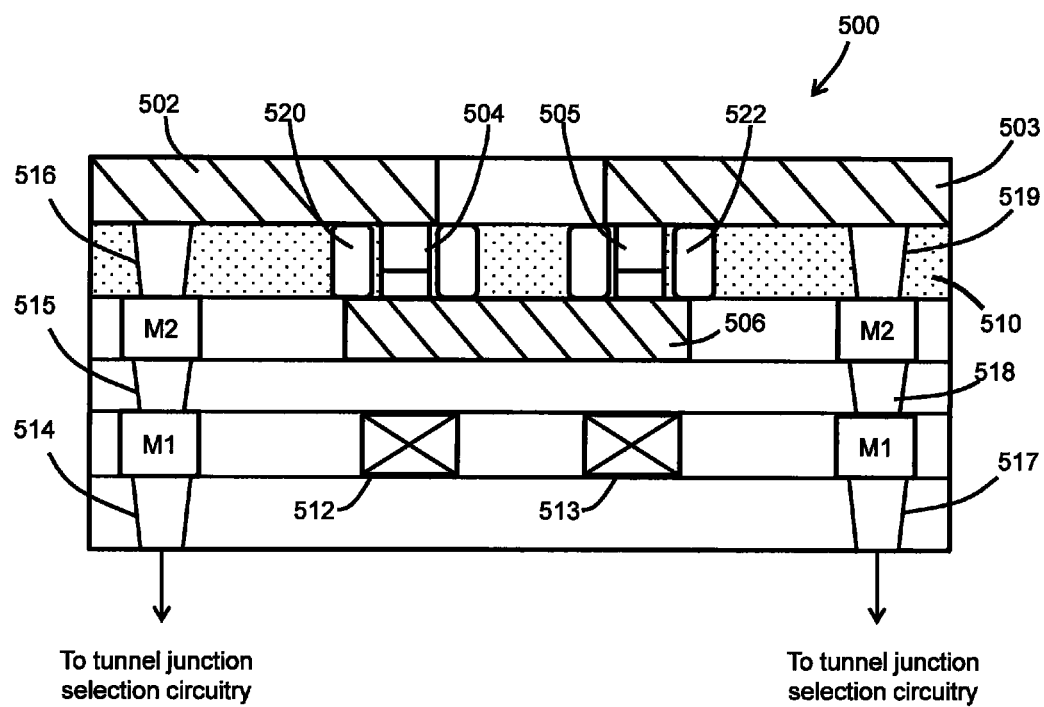
FIG. 5 is an MRAM apparatus according to another embodiment.

FIG. 5 illustrates an MRAM apparatus 500 according to another embodiment. The MRAM apparatus 500 includes first and second contact lines 502 and 503 and first and second tunnel junctions 504 and 505 connected to the same intermediate line 506. An insulating layer 510 is formed on the intermediate line 506, and cavities 520 and 522 are formed in the insulating layer 510 adjacent to the tunnel junctions 504 and 505.

The MRAM apparatus 500 also includes vias 514, 515 and 516 connecting the first contact line 502 to tunnel junction selection circuitry, and vias 517, 518 and 519 connecting the second contact line 503 to the tunnel junction selection circuitry. Although vias 514-519 are illustrated in FIG. 5, embodiments of the invention also encompass an MRAM apparatus in which the contact layers contact tunnel junction selection circuitry without vias, such as by direct connection.

The MRAM apparatus 500 also includes a write line 512 to program a state of the first tunnel junction 504 and a write line 513 to program a state of the second tunnel junction 505. The characteristics of the contact lines, tunnel junctions, intermediate line, insulating layers, write lines and vias may be the same as the corresponding features described above with respect to FIG. 1. Although two configurations of MRAM apparatuses have been described in FIGS. 1 and 5, embodiments of the present invention encompass any configuration of MRAM apparatus, device, circuit, array, etc., in which a cavity is formed in an insulating layer adjacent to a tunnel junction.

Figure 6:
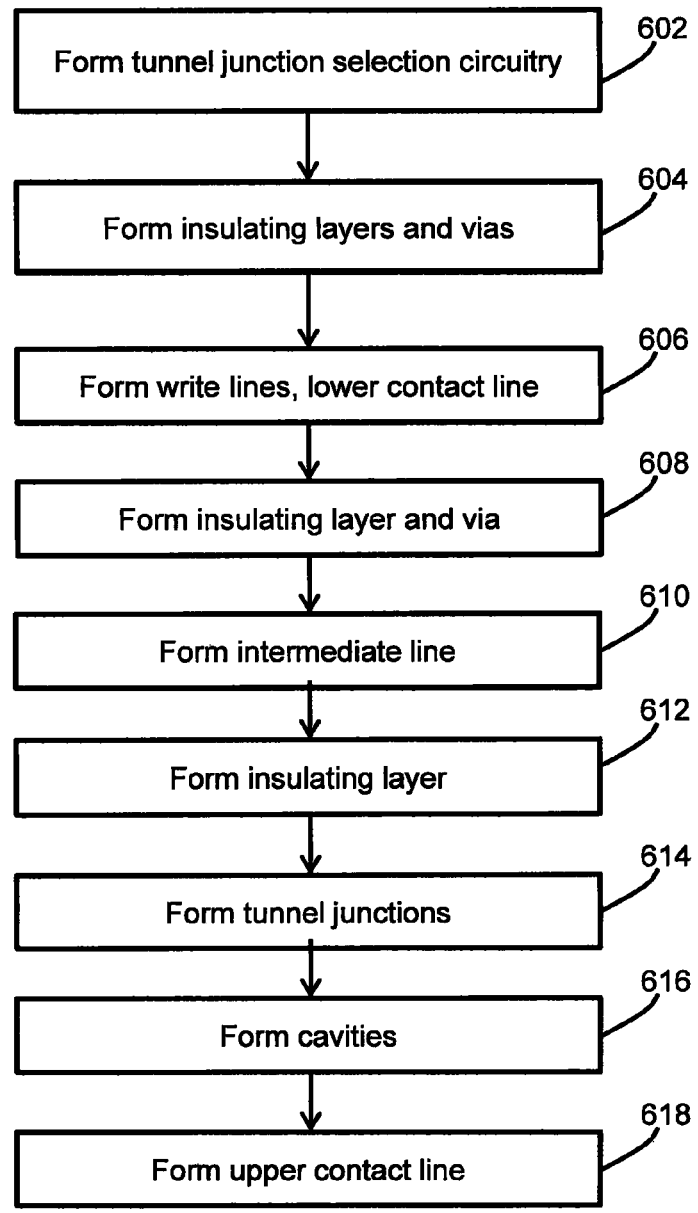
FIG. 6 is a flow diagram of a method of forming an MRAM apparatus according to one embodiment.

FIG. 6 illustrates a flow diagram of a method of forming an MRAM apparatus according to an embodiment of the invention. In some embodiments, tunnel junction selection circuitry, such as transistors, is formed in block 602. Insulating layers, metal layers and vias may be formed on the tunnel junction selection circuitry in block 604. In block 606, write lines are formed, and a lower contact line may also be formed. In one embodiment, the lower contact line is formed on a same metal layer as the write line.

In block 608, an insulating layer is formed on the write lines and a via may be formed in the insulating layer to contact the lower contact line. In block 610, an intermediate line may be formed to contact the via. In block 612, an insulating layer may be formed on the intermediate line, and in block 614, tunnel junctions may be formed in the insulating layer. In block 616, cavities may be formed in the insulating layer adjacent to the tunnel junctions. In one embodiment, the insulating layer may be formed by chemical or laser etching or by photolithography. In another embodiment, the cavities may be formed by a self-assembling polymer. For example, in one embodiment a self-assembling polymer may be formed on the insulating layer, and the self-assembling polymer may arrange itself to form regularly-sized holes at regular intervals. An acid may be provided at locations corresponding to the cavities to form the cavities. The acid may be applied to only particular locations by masking, for example. The self-assembling polymer may then be removed from portions of the insulating layer, or from the portion corresponding to the tunnel junction, leaving behind the cavity around the tunnel junction. Cavities may also be formed adjacent to other surfaces, such as the intermediate line.

In block 618, an upper contact line is formed on the insulating layer to contact the tunnel junction. In addition, another insulating layer may be formed to seal the cavity around the tunnel junction.

In embodiments of the invention, the formation of insulating layers may be performed by any deposition or growth process, including chemical vapor deposition, bath deposition or any other process. In addition, the vias may be formed by any process, such as chemical, laser or physical etching, cutting or drilling. The contact lines and intermediate line may be formed by any deposition process, photolithography or any other process.

In embodiments of the invention, one or more cavities are formed in an insulating layer around a tunnel junction, resulting in an increased thermal insulation of the tunnel junction. Accordingly, when current is applied through the tunnel junction, the heat generated by the current has a greater tendency to stay within the tunnel junction, which may improve the writeability and/or readability of the tunnel junction.

Figure 7:
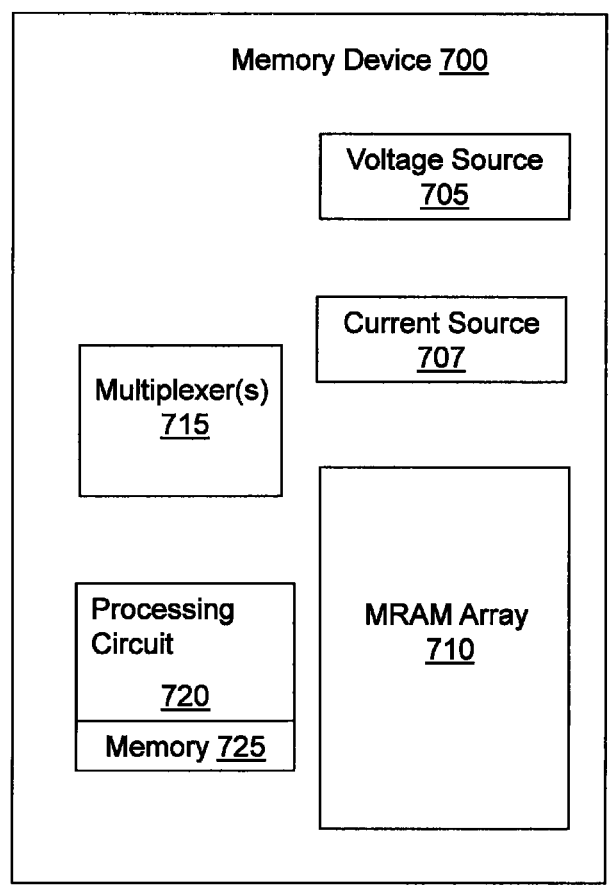
FIG. 7 illustrates a memory device according to an embodiment.

FIG. 7 illustrates a memory device 700 which includes an MRAM array 710 including a plurality of MRAM apparatuses, as illustrated in FIGS. 1 and 5. The memory device 700 is controlled by a memory controller which is a processing circuit 720 as understood by one skilled in the art. The processing circuit 720 may be an application specific integrated circuit (ASIC) for operating the MRAM array as disclosed herein. Also, the processing circuit 720 can execute instructions stored in memory 725 to operate the MRAM array 710 as disclosed herein. The memory device 700 includes and/or is operatively connected to one or more voltage sources 705 supplying voltage bias V to the MRAM array 710 as directed by the processing circuit 720, multiplexers 715 directing signals and current sources 707 supplying electrical current to the write bit lines 108 as directed by the processing circuit 720.

Figure 8:
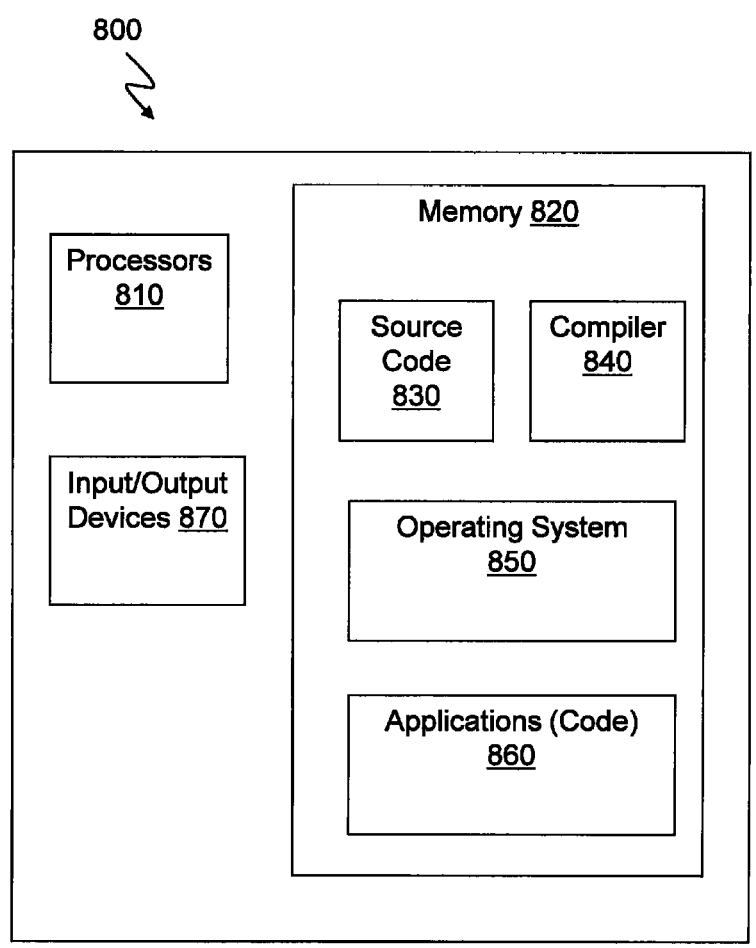
FIG. 8 illustrates a computer including an MRAM array according to an embodiment.

FIG. 8 illustrates an example of a computer 800 (which may include the memory device 700 to operate the features disclosed herein) having capabilities, which may be included in exemplary embodiments. Various methods, procedures, modules, flow diagrams, tools, applications, circuits, elements, equations, and techniques discussed herein may also incorporate and/or utilize the capabilities of the computer 800. Moreover, capabilities of the computer 800 may be utilized to implement features of exemplary embodiments discussed herein. One or more of the capabilities of the computer 800 may be utilized to implement, to incorporate, to connect to, and/or to support any element discussed herein (as understood by one skilled in the art) in FIGS. 1-7.

Generally, in terms of hardware architecture, the computer 800 may include one or more processors 810, computer readable storage memory 820, and one or more input and/or output (I/O) devices 870 that are communicatively coupled via a local interface (not shown). The local interface can be, for example but not limited to, one or more buses or other wired or wireless connections, as is known in the art. The local interface may have additional elements, such as controllers, buffers (caches), drivers, repeaters, and receivers, to enable communications. Further, the local interface may include address, control, and/or data connections to enable appropriate communications among the aforementioned components.

The processor 810 is a hardware device for executing software that can be stored in the memory 820. The processor 810 can be virtually any custom made or commercially available processor, a central processing unit (CPU), a data signal processor (DSP), or an auxiliary processor among several processors associated with the computer 800, and the processor 810 may be a semiconductor based microprocessor (in the form of a microchip) or a microprocessor.

The computer readable memory 820 can include any one or combination of volatile memory elements (e.g., random access memory (RAM), such as dynamic random access memory (DRAM), static random access memory (SRAM), etc.) and nonvolatile memory elements (e.g., ROM, erasable programmable read only memory (EPROM), electronically erasable programmable read only memory (EEPROM), programmable read only memory (PROM), tape, compact disc read only memory (CD-ROM), disk, diskette, cartridge, cassette or the like, etc.). Moreover, the memory 820 may incorporate electronic, magnetic, optical, and/or other types of storage media. Note that the memory 820 can have a distributed architecture, where various components are situated remote from one another, but can be accessed by the processor 810.

The software in the computer readable memory 820 may include one or more separate programs, each of which comprises an ordered listing of executable instructions for implementing logical functions. The software in the memory 820 includes a suitable operating system (O/S) 850, compiler 840, source code 830, and one or more applications 860 of the exemplary embodiments. As illustrated, the application 860 comprises numerous functional components for implementing the features, processes, methods, functions, and operations of the exemplary embodiments. The application 860 of the computer 800 may represent numerous applications, agents, software components, modules, interfaces, controllers, etc., as discussed herein but the application 860 is not meant to be a limitation.

The operating system 850 may control the execution of other computer programs, and provides scheduling, input-output control, file and data management, memory management, and communication control and related services.

The application 860 may be a source program, executable program (object code), script, or any other entity comprising a set of instructions to be performed. When a source program, then the program is usually translated via a compiler (such as the compiler 840), assembler, interpreter, or the like, which may or may not be included within the memory 820, so as to operate properly in connection with the O/S 850. Furthermore, the application 860 can be written as (a) an object oriented programming language, which has classes of data and methods, or (b) a procedure programming language, which has routines, subroutines, and/or functions.

The I/O devices 870 may include input devices (or peripherals) such as, for example but not limited to, a mouse, keyboard, scanner, microphone, camera, etc. Furthermore, the I/O devices 870 may also include output devices (or peripherals), for example but not limited to, a printer, display, etc. Finally, the I/O devices 870 may further include devices that communicate both inputs and outputs, for instance but not limited to, a NIC or modulator/demodulator (for accessing remote devices, other files, devices, systems, or a network), a radio frequency (RF) or other transceiver, a telephonic interface, a bridge, a router, etc. The I/O devices 870 also include components for communicating over various networks, such as the Internet or an intranet. The I/O devices 870 may be connected to and/or communicate with the processor 810 utilizing Bluetooth connections and cables (via, e.g., Universal Serial Bus (USB) ports, serial ports, parallel ports, FireWire, HDMI (High-Definition Multimedia Interface), etc.).

When the computer 800 is in operation, the processor 810 is configured to execute software stored within the memory 820, to communicate data to and from the memory 820, and to generally control operations of the computer 800 pursuant to the software. The application 860 and the O/S 850 are read, in whole or in part, by the processor 810, perhaps buffered within the processor 810, and then executed.

When the application 860 is implemented in software it should be noted that the application 860 can be stored on virtually any computer readable storage medium for use by or in connection with any computer related system or method.

The application 860 can be embodied in any computer-readable medium for use by or in connection with an instruction execution system, apparatus, server, or device, such as a computer-based system, processor-containing system, or other system that can fetch the instructions from the instruction execution system, apparatus, or device and execute the instructions.

In exemplary embodiments, where the application 860 is implemented in hardware, the application 860 can be implemented with any one or a combination of the following technologies, which are each well known in the art: a discrete logic circuit(s) having logic gates for implementing logic functions upon data signals, an application specific integrated circuit (ASIC) having appropriate combinational logic gates, a programmable gate array(s) (PGA), a field programmable gate array (FPGA), etc.

It is understood that the computer 800 includes non-limiting examples of software and hardware components that may be included in various devices, servers, and systems discussed herein, and it is understood that additional software and hardware components may be included in the various devices and systems discussed in exemplary embodiments.

As will be appreciated by one skilled in the art, aspects of the present invention may be embodied as an apparatus, system, method or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wireline, optical fiber cable, RF, etc., or any suitable combination of the foregoing.

Computer program code for carrying out operations for aspects of the present invention may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention have been described with reference to flowchart illustrations and/or block diagrams of methods, apparatus (systems) and computer program products. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

The flowchart and block diagrams in the Figures illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the blocks may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one more other features, integers, steps, operations, element components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the disclosure in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated While a preferred embodiment has been described, it will be understood that those skilled in the art, both now and in the future, may make various improvements and enhancements which fall within the scope of the claims which follow.

What is claimed is:

1. A method of forming a magnetoresistive random access memory (MRAM) apparatus, comprising:
    forming a first conductive line on a first insulating layer;
    forming a second insulating layer on the first conductive line;
    forming a magnetic tunnel junction through the second insulating layer to contact the first conductive line;
    forming a cavity adjacent to the magnetic tunnel junction in the second insulating layer; and
    forming a second conductive line on the second insulating layer to contact the magnetic tunnel junction.

2. The method of claim 1, wherein forming the cavity includes etching the second insulating layer.

3. The method of claim 2, wherein forming the cavity comprises:
- forming a self-arranging polymer on the second insulating layer, the self-arranging polymer forming holes of predetermined sizes at regular intervals; and
- applying an acid to the second insulating layer through the self-arranging polymer to form the cavity.

4. The method of claim 1, wherein the cavity is formed by photolithography.

5. The method of claim 1, further comprising:
- forming a conductive write line; and
- forming the first insulating layer on the conductive write line,
- wherein the magnetic tunnel junction is formed above the conductive write line.

* * * * *